United States Patent [19]
Ha

[11] Patent Number: 5,406,519
[45] Date of Patent: Apr. 11, 1995

[54] REAL-ONLY MEMORY DEVICE INCORPORATING STORAGE MEMORY ARRAY AND SECURITY MEMORY ARRAY COUPLED TO COMPARATOR CIRCUIRTRY

[75] Inventor: Chang W. Ha, Ichonkun, Rep. of Korea

[73] Assignee: Hyundai Electronics Industries, Co., Ltd., Kyoungkido, Rep. of Korea

[21] Appl. No.: 981,330

[22] Filed: Nov. 24, 1992

[30] Foreign Application Priority Data

Nov. 25, 1991 [KR] Rep. of Korea ............... 1991-21107

[51] Int. Cl.⁶ ............................................. G11C 7/00
[52] U.S. Cl. ........................................ 365/195; 365/104;
365/189.05; 365/225.7; 365/233.5; 365/236;
365/194; 365/196; 365/228; 235/382
[58] Field of Search ................... 365/104, 226, 189.05,
365/205, 225.7, 233.5, 240, 236, 194, 195, 196,
228; 235/380, 382, 492; 380/23-25; 340/825.34;
307/443

[56] References Cited

U.S. PATENT DOCUMENTS

| | | | |
|---|---|---|---|
| 4,268,911 | 5/1981 | Bell | 365/104 |
| 4,446,475 | 5/1984 | Gercekci et al. | 365/195 |
| 4,590,552 | 5/1986 | Guttag et al. | 364/200 |
| 4,593,384 | 6/1986 | Kleijne | 365/228 |
| 4,698,750 | 10/1987 | Wilkie et al. | 364/200 |
| 4,734,568 | 3/1988 | Watanabe | 235/447 |
| 4,812,675 | 3/1989 | Goetting | 307/443 |
| 4,819,202 | 4/1989 | Schrenk | 364/900 |
| 4,819,204 | 4/1989 | Schrenk | 364/900 |
| 4,821,240 | 4/1989 | Nakamura et al. | 365/228 |
| 4,852,044 | 7/1989 | Turner et al. | 364/900 |
| 4,864,542 | 9/1989 | Oshima et al. | 365/189.01 |
| 4,926,388 | 5/1990 | Kunita et al. | 365/244 |
| 4,933,898 | 6/1990 | Gilberg et al. | 365/53 |
| 4,958,323 | 9/1990 | Sugawara et al. | 365/189.01 |
| 4,975,870 | 12/1990 | Knicely et al. | 364/900 |
| 5,083,293 | 1/1992 | Gilberg et al. | 365/189.01 |
| 5,097,445 | 3/1992 | Yamauchi | 365/195 |
| 5,173,876 | 12/1992 | Kawashima et al. | 365/189.07 |
| 5,175,840 | 12/1992 | Sawase et al. | 395/425 |
| 5,206,938 | 4/1993 | Fujioka | 395/400 |
| 5,216,633 | 6/1993 | Weon et al. | 365/189.07 |
| 5,237,531 | 8/1993 | Okano et al. | 365/189.01 |
| 5,237,609 | 8/1993 | Kimura | 380/3 |
| 5,293,610 | 3/1994 | Schwarz | 395/425 |

FOREIGN PATENT DOCUMENTS 0467355 1/1992 European Pat. Off. ....... 365/189.05

Primary Examiner—Joseph A. Popek
Assistant Examiner—Andrew Q. Tran
Attorney, Agent, or Firm—Darby & Darby

[57] ABSTRACT

A security read only memory(ROM) device for maintaining security of data therein is provided. The ROM device comprises a security memory cell array 11 including a storage cell array for storing user program data and a security code cell array for storing security code data, and a control section 14 for providing a signal depending on the comparison result from the comparison section 11 so that if the external input data are equal to security code data in all addresses, the data stored in the storage cell array can be read during power-on and if not, regardless of power-on-on/off states, the data stored in the storage cell array can not be read. The ROM device also comprises an address pattern recognition section 15, responsive to a clock signal from the control section 14, address signals from row and column address buffers 1 and 2 and the reset signal from the pulse generator 13, for providing a code compare enable signal (CCES) depending on the input address signals to the control section, so that the control section 14 and the comparison section 12 can be operated after a predetermined address pattern.

10 Claims, 3 Drawing Sheets

REAL-ONLY MEMORY DEVICE INCORPORATING STORAGE MEMORY ARRAY AND SECURITY MEMORY ARRAY COUPLED TO COMPARATOR CIRCUIRTRY

BACKGROUND OF THE INVENTION

1. Field of Invention

The present invention relates to a Read Only Memory (ROM) device and, in particular, to a security ROM device for maintaining security of data contents therein.

2. Description of the Prior Art.

Referring to FIG. 1 illustrating a conventional ROM device wherein the input data consists of 4 bits, this ROM device includes a row address buffer 1, a column address buffer 2, a row decoder 3, a column decoder 4, a storage cell array 5, a sense amplifier 6, an output buffer 7, an output enable signal buffer 8, a chip enable signal buffer 9, and a output buffer drive section 10.

In FIG. 1, a function of the storage cell array 5 is to store the user data and a function of the row and column decoders 3 and 4 is to select a desired cell in the storage cell array 5. Generally, the output lines of the row decoder 3 are connected to the respective gates of the cells in the storage cell array 5. The column decoder 4 is connected to the storage cell array 5 and to the sense Amplifier 6 for sensing the information stored in a cell selected by the row and column decoders.

The address signals from the row and column address buffers 1 and 2 are applied to the row and column decoders 3 and 4 respectively and the output signals of the sense amplifier 6 are outputted through the output buffer 7. The output buffer 7 is enabled or disabled by an output enable pin. Also, because the ROM device has a chip enable function, all elements of the ROM device may be controlled by a value of the chip enable pin. The chip enable (CE) signal is typically used in a TTL-CMOS level conversion circuit in which a TTL input signal is converted into a CMOS signal and in the sense amplifier. Also the CE signal may be used to form a signal together with the output of the output enable buffer. For example, because when the chip is disabled by the CE signal from the chip enable pin, the standby current is less than 100 µA. It is possible to disable the sense amplifier, the level conversion circuit, etc. through which the current may flow at that time, by means of the output signal of the chip enable buffer. Also, the output buffer may be disabled. The output buffer drive section 10 enables the output buffer 7 when the output enable signal and the chip enable signal are applied.

In the conventional ROM device described above, because the data are stored in the storage cell array 5, it is possible to read the desired data by means of addresses designating the locations of the memory cells. For example, in the conventional ROM, EPROM, EEPROM, flash EPROM, etc. the data stored in the memory cell array can be easily read by applying addresses to the address pins after maintaining the chip enable and output pins to the desired voltage level. Accordingly, it is very difficult to protect the data from being read by those who want to read the data.

In order to solve such a problem, a ROM device disclosed in U.S. Pat. No. 4,268,911 comprises a permanent register for storing a code having a security function, thereby the contents programed in one ROM can be distinguished from the contents programed in other ROM devices, a test pin for reading the data and selecting a desired mode, and a fuse connected to the test pin.

However, this Patent has problems that the chip size increases because of the permanent register and thus it is difficult to increase the number of permanent register bits. Also, because of using of a test pin, it cannot be applied to the commercially available ROM devices in which there is no test pin in the system user mode.

SUMMARY OF THE INVENTION

Accordingly, an object of the invention is to provide a ROM device which includes a storage cell array for storing data therein and a security code cell array for storing security codes therein, whereby the data stored in the storage cell array can be read by only those who know security codes. In the ROM device according to the invention, after power is applied to the ROM, external input data are compared with the data stored in the security code cell array 11. Then, if these data are equal to each other, the data stored in the storage cell array in the security memory cell array can be read during the power-on state, but if not, the data cannot be read permanently regardless of the power-on/off states. When the state of power source is changed from off-state to on-state again, above comparison step is repeated.

Other objects, advantages and features of the present invention will be understood and appreciated upon review of the detailed description of the invention provided below, which should be considered in conjunction with the accompanying drawings.

DETAILED DESCRIPTION OF THE PREFERRED EMBODIMENT

Figure 1:
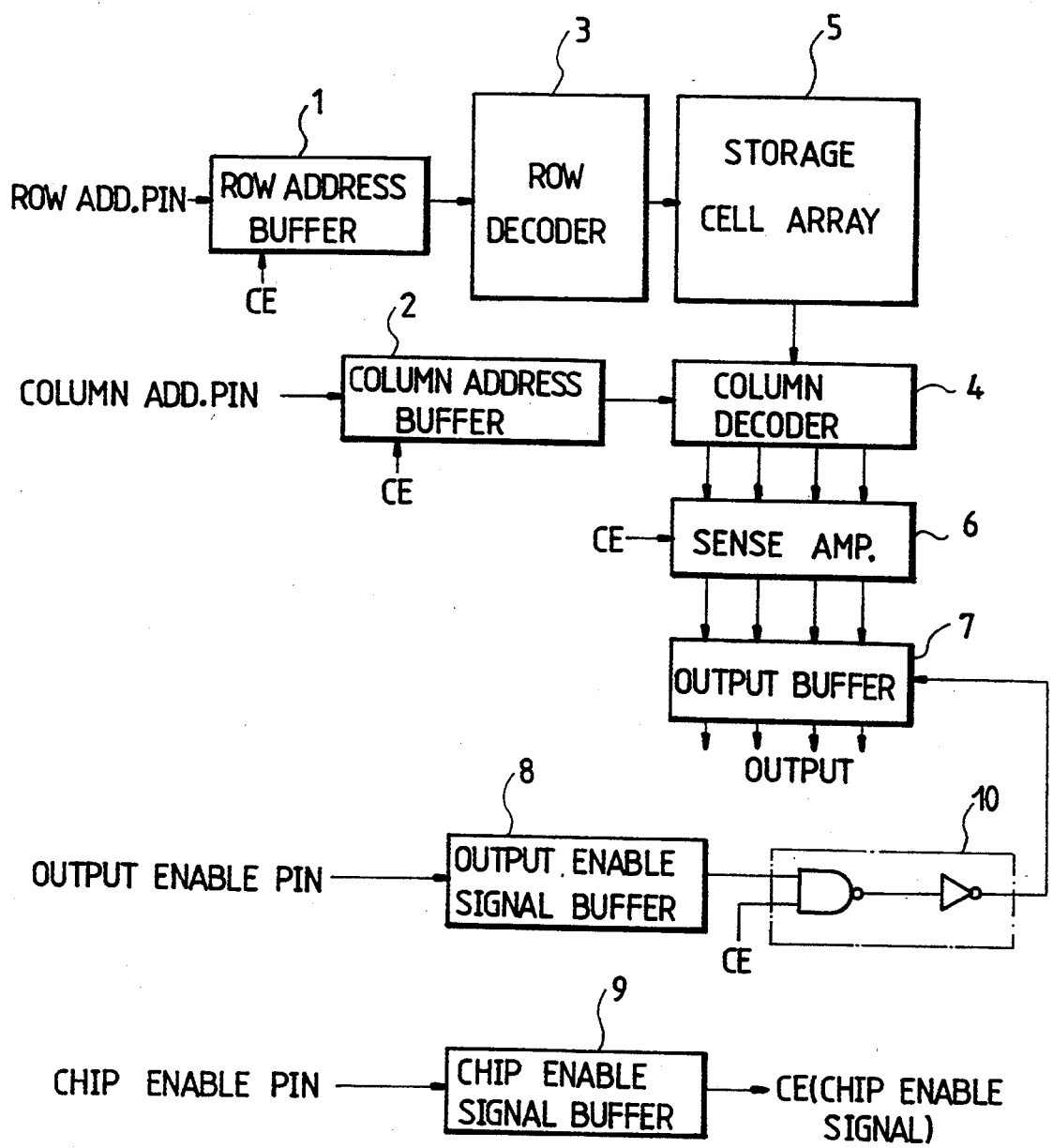
FIG. 1 is a block diagram of a ROM device according to the prior art.
Figure 2:
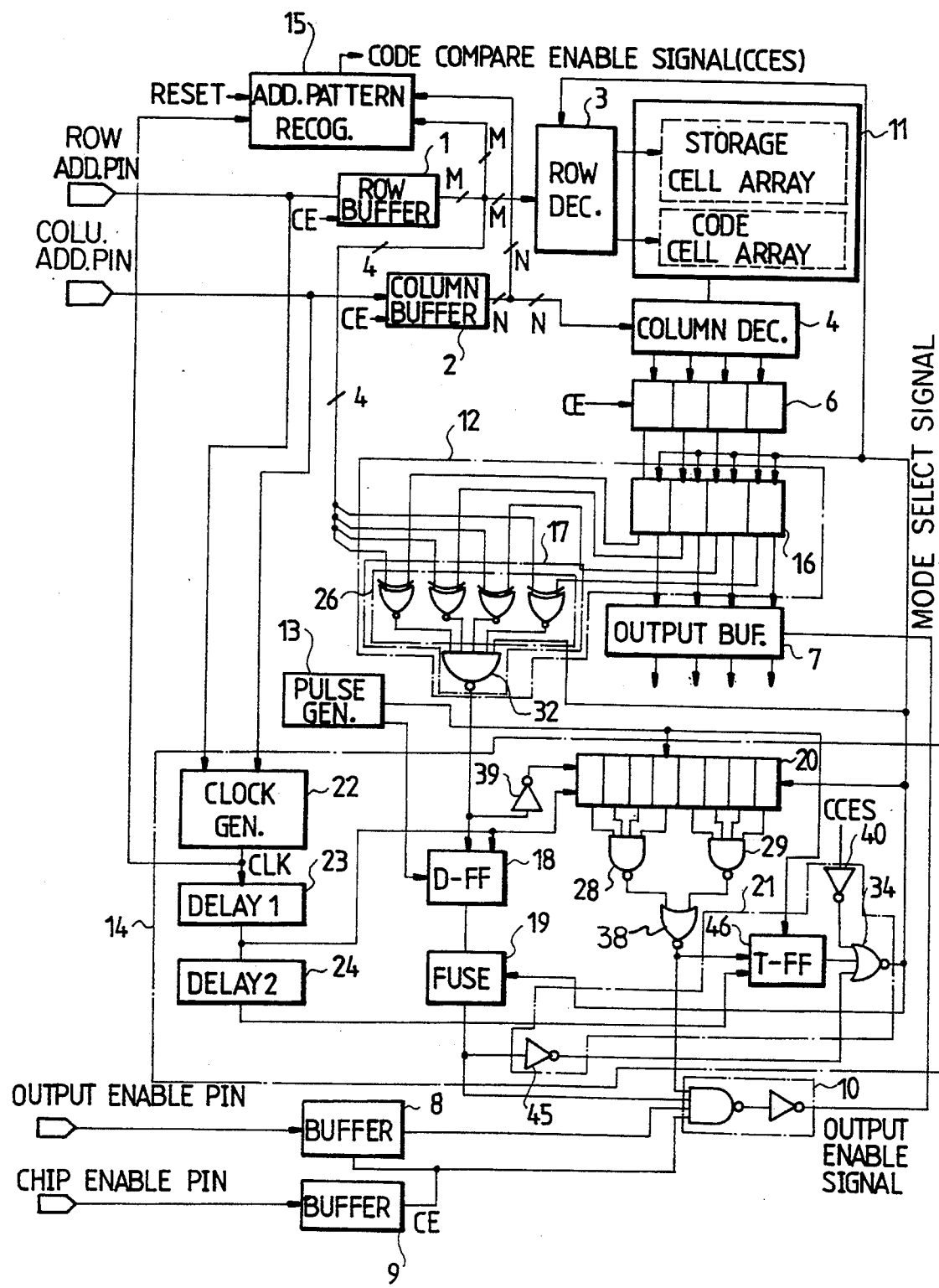
FIG. 2 is a block and logic diagram of a security ROM device according to a preferred embodiment of the present invention.
Figure 3:
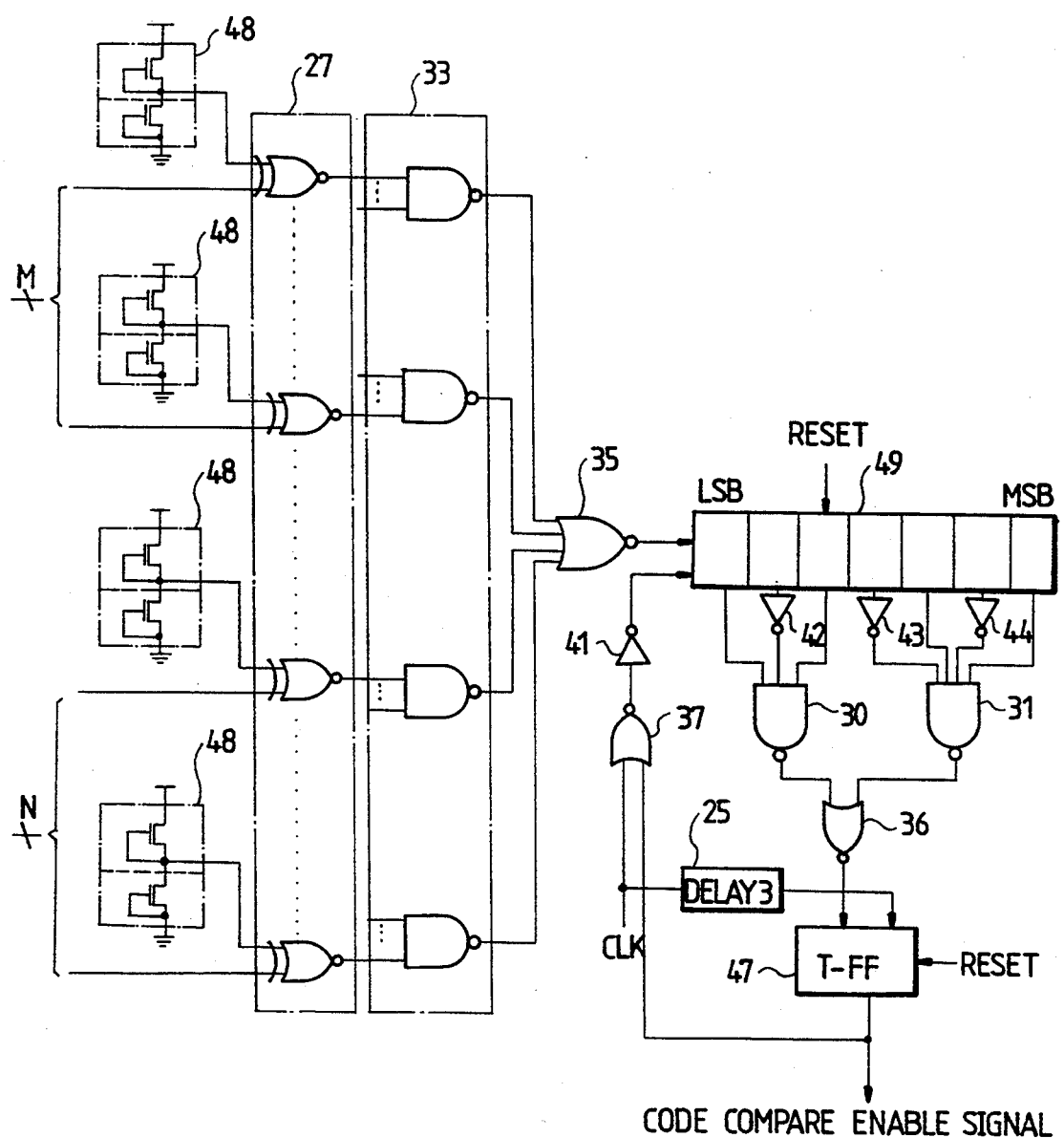
FIG. 3 is a block and logic diagram of a address pattern recognition section in the ROM device according to the present invention.

Referring to FIG. 2 illustrating an embodiment in accordance with the present invention and FIG. 3 illustrating the address pattern recognition section, 11 denotes a security memory cell array including a security code cell array and a storage cell array, 12 denotes a comparison section, 13 denotes a pulse generator, 14 denotes a control section, 15 denotes an address pattern recognition section, 16 denotes a path selection logic section, 17 denotes a comparison output section, 18 denotes a D Flip-Flop (D-FF), 19 denotes a fusable circuit section, 20 denotes a counter, 21 denotes a mode select section, 22 denotes an address transition detection and clock generation section, 23, 24 and 25 denote delay sections, 26 and 27 denote exclusive-NOR(EXNOR) gate arrays, 28, 29, 30, 31 and 32 denote NAND gates, 33 denotes a NAND gate array, 34, 35, 36, 37 and 38 denote NOR gates, 39, 40, 41, 42, 43; 44 and 45 denote NOT gates, 46 and 47 denote toggle Flip-Flops, 48 denotes a reference voltage applying section, and 49 denotes a shift register.

As shown in FIG. 2 and FIG. 3, the ROM device according to the invention comprises a chip enable signal buffer 9 connected to a chip enable (CE) pin, a row address buffer 1 which is connected to a row address pin and to which a chip enable (CE) signal is applied, a column address buffer 2 which is connected to the column address pin and to which CE signal is applied, a row decoder 3 connected to the row address buffer 1, a security memory cell array 11 including a storage cell array for storing user program data and a security code cell array for security code data. Also included are a column decoder 4 connected to the column address buffer 2 and the security memory cell array 11, a sense amplifier 6 which is connected to the column decoder 4 and to which the CE signal is applied, a comparison section 12 connected to the row address buffer 1 and the sense amplifier 6, for comparing external input data with the security code data stored in the security memory cell array 11, an output buffer 7 connected to the comparison section 12, a pulse generator 13 for a power on reset pulse, a control section 14 which is connected to the comparison section 12, the pulse generator 13 and the row and column address pins, for providing a control signal depending on the comparison result from the comparison section 12. If the external input data is coincident with the security code data in all addresses, the data stored in the storage cell array can be read during power-on and if not, regardless of power-on/off states, the data stored in the storage cell array can not be read. The ROM device further includes an address pattern recognition section 15 responsive to a clock signal from the control section 14, address signals from the row and column address buffers 1 and 2 and the reset signal from the pulse generator 13, for providing a code compare enable signal (CCES) depending on the input address signals to the control section 14. An output enable signal buffer 8 connected to an output enable pin, and an output drive section 10 connected to the output enable signal buffer 8, the chip enable signal buffer 9 and the control section 14, for providing an output enable signal to the output buffer 7.

Also, the comparison section 12 includes a path selection logic section 16 connected to the sense amplifier 6 and to the control section 14, for controlling the output path of the sense amplifier 6, and a comparison output section 17 for comparing the addresses from the row address buffer 1 with the security code data. The comparison output logic 17 includes an EXNOR gate array 26 which is connected to the path selection logic section 16 and the row address buffer 1, and a NAND gate 32 connected to the EXNOR gate array 26.

In addition, the control section 14 includes a D-Flip Flop 18 connected to the output stage of the comparison output logic 17 in the comparison section 12 and to the pulse generator 13, a fusable circuit section 19 connected to the output stage of the D-Flip Flop 18 and the output drive section 10, a counter 20 connected to the output stage of the comparison section 17 through a NOT gate 39 and to the pulse generating section 13. NAND gates 28 and 29 are connected to the output stage of the counter 20, a NOR gate 38 has its input stage connected to the output stage of the NAND gates 28 and 29 and its output stage is connected to the output drive section 10, a mode selection section 21 for generating a mode select signal, an address transition detector and clock generator 22 connected to the row and column address pins and the address pattern recognition section 15, for generating a clock signal upon detecting the address transition. Also provided are a first delay section 23 for delaying the clock signal from the address transition detector and clock generator 22 and then supplying a delayed clock signal to the counter 20 and the D-Flip-Flop 18, and a second delay section 24 for delaying the delayed clock signal from the first delay section 23 and then supplying a secondly delayed clock signal to a toggle Flip-flop 46 in the mode selection section 21. The mode selection section 21 includes a NOT gate 45 connected to the output stage of the fusable circuit 19, a toggle flip-flop 46 connected to the output stage of the NOR gate 38, a NOT gate 40 to which the code comparison enable signal from the address pattern recognition section 15 is applied, and a NOR gate 34 having input stages each connected to the output of the NOT gate 40, the output of the NOT gate 45, and the output of the toggle Flip-Flop 46.

In addition, the address pattern recognition section 15 in the ROM device according to the invention comprises a plurality of a reference voltage applying sections 48 each including two MOSFET's for providing the reference voltage of a low or high state, an EXNOR gate array 27 which has one input connected to a reference voltage applying section 48 and the other input connected to the output stages of the row and column address buffers 1 and 2, a NAND gate array 33 connected to the EXNOR gate array 27, a NOR gate 35 connected to the NAND gate array 33, a 7-bit shift register 49 which is connected to the NOR gate 35 and to which the reset signal from the pulse generating section 13 is applied. Further included are a first NAND gate 30 having two input stages directly connected to 1st and 3rd bit output stages of the shift register 49 respectively and another input stage connected to the 2nd bit output stage through the NOT gate 42, a second NAND gate 31 having two input stages directly connected to 5th and 7th bit output stages of the shift register 49 respectively and two other input stages connected to 4th and 6th bit output stages through the NOT gates 43 and 44 respectively. There is also provided a NOR gate 36 having input stages connected to the NAND gates 30 and 31 respectively, a toggle Flip-Flop 47 for generating a code comparison enable signal, which is connected to the NOR gate 36 and to which the reset signal is applied from the pulse generator 13, a delay section 25 for delaying the clock signal from the address transition detection and clock generator 22 in the control section 14 and then supplying a delayed clock signal to the toggle Flip-Flop 47. A NOR gate 37 is provided to which the clock signal from the address transition detection and clock generating section 22 and the code compare enable signal from the toggle Flip-Flop 47 are applied, and the output thereof is applied to the shift register 49 through a NOT gate 41.

Now a more detailed description of the preferred embodiment of the invention will be described below.

In the ROM device according to the invention, after power is applied to the ROM, the external input data are compared with the data stored in the security code cell array in security memory cell array 11. Then, if the data are equal to each other, the data stored in the storage cell array in the security memory cell array can be read during the power-on state, but if not, the data can not be read permanently regardless of the power-on/off states. When the state of the power source is changed from off-state to on-state again, the above comparison step is repeated.

The security memory cell array 11 shown in FIG. 2 includes the storage cell array for storing the user data and the security code cell array in which the security code data are stored. The row and column decoders 3 and 4 are used to designate particular row and column lines. The row line addresses of the security code cell array are coincident with the row addresses in a specified region of the storage cell array, but these addresses can be distinguished by a mode selection signal from the control section 14.

When the power goes to the on-state, the pulse generating section 13 generates a instantaneous pulse, by which the output state of the D-Flip-Flop 18 in the control section 14 is set to 1, the output state of the toggle Flip-Flop 46 in mode selection section 21 is reset to 0, and the 8-bit counter 20 is reset to "OOH". Also, the 7-bit shift register 49 in address pattern recognition section 15 is reset to "OOH" and the toggle Flip Flop 47 is reset to 0.

Accordingly, the code compare enable signal generated from the address pattern recognition section 15 goes to a low state and also the mode select signal generated by the mode selection section 21 goes to a low state. Thereafter, a high voltage is applied to the chip enable pin.

When the mode select signal is in the low state, the storage memory cell array is selected by the row decoder 3, and the output of the sense amplifier 6 is forwarded to the output buffer 7 by means of the path select logic section 16, and then the counter 20 and the fusable circuit section 19 in the control section 14 are disabled, and thus these cannot receive the outputs from elements arranged before them.

At this time, because the output of counter 20 becomes "OOH", the output enable signal generated by the output buffer drive section 10 is in a low state. Accordingly, the output of the sense amplifier 6 can not be output through the output buffer 7. To control the output enable signal by only the output enable and chip enable pins, the outputs of the counter 20 and the fusable circuit 19 must be in an "FFH" state and a high state respectively.

The reference voltage applying section 48 in the address pattern recognition section 15 sets respective individual inputs of the 2-input Exclusive NOR gates 27 to a High or Low state, depending on user programmed data in the ROM device. Thus, only for specified addresses of the external input addresses are the outputs of the EXNOR gate array 27 in High state.

Herein, the reference voltage applying section 48 includes two MOSFET's. One of these two MOSFET's may be made of a depletion type by means of a MASK implantation, and thus it is possible to set a line connecting the two MOSFET's to a High or Low state. The reference voltage applying section 48 may be realized by means of EEPROMs, PROMs etc. Next, a series of particular addresses are applied, thereby satisfying the state of the shift register 49 with "1010101". Then, the toggle Flip-Flop 47 outputs a code compare enable signal having a High state. At this time, because the output from the fusable circuit 19 is High and the output from the toggle Flip-Flop 46 is Low, the mode select signal from the mode select section 21 becomes High.

When the mode select signal becomes High, the row decoder 3 performs the selection of the security code cell array, the path selection logic section 16 transmits the result of the sense amplifier 6 to the comparison output logic 17, and the 8-bit counter 20 and the fusable circuit section 19 are enabled. In this state, address signals are input through the row and column address inputs to designate the row and column lines of the security code cell array. At the same time, 4-bit data to be compared with the cell data stored in the security code cell array are also input through the 4 row address inputs.

In addition, when a transition of the address occurs, the address transition detection and clock generator 22 connected to the address input pins generates a clock pulse CLK and first and second delay sections 23 and 24 delay sequentially the clock pulse CLK. The first delaying of the clock pulse is performed by reason that after the security code cell data sensed by the sensed amplifier 6 are compared with the external input data, the result of the comparison is to be input to the counter 20 and the Flip-Flop 18. The purpose of the second delay is to compensate the gate propagation delay time from the input stage of the counter 20 to the input stage of the toggle flip-flop 46 in the mode select section 21. The clock signal is to be input to the NOR gate 37 in the address pattern recognition section 15 shown in FIG. 3.

In the case that the 4-bit data correspond to the data stored in the security code cell array, the count of the counter 20 is increased by 1 and the output of the D Flip-Flop 18 is maintained at one (1). However, when the external 4-bit data do not correspond to the security code cell data, the count of the counter 20 is not increased and the output of the D Flip-flop 18 becomes a zero (0). Then, the output of the fusable circuit 19 including a fuse is maintained in a Low state permanently. The fusable circuit 19 may be constructed by means of PROM's or EEPROM's.

Because the output of the fusable circuit 19 is in a Low state, the output drive section 10 always outputs an output enable signal of a Low state.

Therefore, the data stored in the ROM device cannot be read regardless of the power-on or power-off.

On the other hand, if the output enable signal is not in a Low state, i.e., when the external 4-bit data correspond to the 4-bit data of the security code array, comparing operations are performed 256 ($2^8=256$) times until all bit positions of the 8-bit counter 20 are filled with one (1). Accordingly, in order that the output buffer 7 may be controlled by only the output enable and chip enable signals, the 256 data comparison results must be equal to one another.

When the output of the fusable section 19 is in high state and the counter 20 is "FFH" (i.e. when all of the external input data correspond to the data stored in the security code cell array during comparing operations of 256 times), the output of the toggle flip-flop 46 in the mode select section 21 becomes one (1) and thus the mode selection signal becomes a Low state. Therefore, the normal read operation can be performed in the ROM device. Namely, it is possible to read the data by adjusting the chip enable signal and the output enable signal to a proper level and then applying the address signals to the address pins. Accordingly, the data stored in the secret code cell array can not be read by those who do not know the security code cell data in advance.

It should be understood that various alternatives to the embodiment of the invention disclosed herein may be employed in practicing the invention. It is intended that the following claims define the invention and that circuits within the scope of these claims and their equivalents be covered thereby.

What is claimed is:

1. A Read Only Memory (ROM) device for maintaining security of data in the ROM device comprising:
    a row address buffer connected to a row address pin for generating a row address, a column address buffer connected to a column address pin for generating a column address, row and column decoders each connected to the row and column address buffers, a security memory cell array coupled to said row and column decoders, including a storage memory cell array for storing program data of a user, and a security code cell array in which data bits of a security code are stored for maintaining the security of said program data, a sense amplifier connected to the column decoder, a comparison section connected to the output of the row address buffer and the sense amplifier for comparing data applied from outside the security code cell array with data stored in the security memory cell array, the row and column addresses designating the location of said security code cell array data, an output buffer connected to the comparison section, a control section connected to the comparison section, the row address pin, the column address pin and the row decoder, for providing a control signal, so that, if the comparison result of the comparison section indicates that the data applied from the outside are coincident with the stored security code cell array data in all address, then during the power on state the data of storage memory cell array can be read, otherwise, regardless of the power-on state, the data of storage memory cell array can not be read, an instantaneous pulse generator connected to the control section for forming a initial state of the control section at the time when power is initially turned on, an output enable signal buffer connected to an output enable pin for transmitting an output enable signal, an output buffer drive section, connected to the output enable signal buffer and the control section, for driving the output enable signal, and a chip enable signal buffer connected to the row address buffer, the column address buffer, the sense amplifier, the output enable signal buffer and the output buffer drive section, for applying a chip enable signal to at least one of the row address buffer and column address buffer.

2. The ROM device of claim 1 further comprising a address pattern recognition section connected to the control section for receiving a clock signal and connected to the row address buffer and column address buffer for receiving the row address and column address for operating the comparison section and the control section after reception of a predetermined address pattern, by applying a code comparison enable signal to the control section.

3. The ROM device of claim 2 wherein said comparison section includes a path selection logic section having an input stage connected to the output of the sense amplifier and a mode selection signal of the control section, and an output stage connected to the input stage of the output buffer, for controlling the output path of the sense amplifier and, a comparison output section including a first EXNOR gate array connected to the output of the row address buffer and to the output of the path selection logic section, and a first NAND gate connected to the first EXNOR gate array.

4. The ROM device of claim 3 wherein said control section includes a D-Flip Flop connected to the output stage of the comparison output section in the comparison section and to a set signal stage of the instantaneous pulse generator, a fusable section in which the input stage is connected to the output stage of the D-Flip Flop and the output stage is connected to the output buffer drive section, a counter connected to the output stage of the comparison section through a NOT gate and to a reset signal stage of the instantaneous pulse generator, second and third NAND gates connected to the output stage of the counter, a first NOR gate in which the input stage is connected to the output stage of the second and third NAND gates and the output stage is connected to the output buffer drive section, a mode selection section connected to the first NOR gate, the reset signal stage of the instantaneous pulse generator, the code comparison enable signal and to the fusable section, for generating said mode selection signal, a address transition detect and clock generator connected to the row and column address pins for generating said clock signal according to the address transition detection and then supplying the clock signal to the address pattern recognition section, a first delay section for firstly delaying the clock signal received from the address transition detect and clock generator and then supplying a delayed clock signal to the counter and the D-Flip Flop, a second delay section for secondly delaying the first delayed clock signal received from the first delay section and then supplying a secondly delayed clock signal to the mode selection section.

5. The ROM device of claim 4 wherein said mode selection section includes a first NOT gate connected to the output stage of the fusable section, a toggle flip-flop connected to the output stage of the first NOR gate, a second NOT gate connected to the code comparison enable signal from the output stage of the address pattern recognition section and, a second NOR gate having inputs connected to the first NOT gate output, the toggle flip flop output and to the second NOT gate output.

6. The ROM device of claim 3 wherein said address pattern recognition section includes a reference voltage applying section comprising two MOS FETs for providing a reference voltage of a low or high state, a second EXNOR gate array having a first input connected to the reference voltage applying section and a second input connected to the output stage of the row and column address buffer, a NAND gate array connected to the output stage of the second EXNOR gate array, a third NOR gate connected to the output stage of the NAND gate array, a 7 bit shift register connected to the output stage of the third NOR gate and to a reset signal stage of the instantaneous pulse generator, a second NAND gate having a first input stage directly connected to the first, third, fifth and seventh output bits of the shift register, and a second input stage connected to the second, fourth and sixth output bits of the shift register through respective NOT gates, a fourth NOR gate in which the input stage is connected to the output stage of the second NAND gate, a second toggle Flip-Flop connected to the output stage of the fourth NOR gate and to the reset signal stage of the instantaneous pulse generator for generating said code comparison enable signal, a third delay section connected to the output stage of an address transition detect and clock generator in the control section for delaying the clock signal and then supplying a delayed clock signal to the second toggle Flip-Flop and, a fifth NOR gate in which the input stages are connected to the clock signal generated from the address transition detect and clock generator and to the code comparison enable signal generated from the second toggle flip-flop and, the output stage is connected to the shift register through a NOT gate.

7. The ROM device of claim 1 wherein said comparison section includes a path selection logic section having an input stage connected to the output of the sense amplifier and a mode selection signal of the control section, and an output stage connected to the input stage of the output buffer, for controlling the output path of the sense amplifier and, a comparison output section including a first EXNOR gate array connected to the output of the row address buffer and to the output of the path selection logic section, and a first NAND gate connected to the first EXNOR gate array.

8. The ROM device of claim 7 wherein said control section includes a D-Flip Flop connected to the output stage of the comparison output section in the comparison section and to a set signal stage of the instantaneous pulse generator, a fusable section in which the input stage is connected to the output stage of the D-Flip Flop and the output stage is connected to the output buffer drive section, a counter connected to the output stage of the comparison section through a NOT gate and to a reset signal stage of the instantaneous pulse generator, second and third NAND gates connected to the output stage of the counter, a first NOR gate in which the input stage is connected to the output stage of the second and third NAND gates and the output stage is connected to the output buffer drive section, a mode selection section connected to the first NOR gate, the reset signal stage of the instantaneous pulse generator, a code comparison enable signal and to the fusable section, for generating said mode selection signal, a address transition detect and clock generator connected to the row and column address pins for generating a clock signal according to the address transition detection and then supplying the clock signal to an address pattern recognition section, a first delay section for firstly delaying the clock signal received from the address transition detect and clock generator and then supplying a delayed clock signal to the counter and the D-Flip Flop, a second delay section for secondly delaying the first delayed clock signal received from the first delay section and then supplying a secondly delayed clock signal to the mode selection section.

9. The ROM device of claim 8 wherein said mode selection section includes a first NOT gate connected to the output stage of the fusable section, a toggle flip-flop connected to the output stage of the first NOR gate, a second NOT gate connected to the code comparison enable signal from the output stage of the address pattern recognition section and, a second NOR gate having inputs connected to the first NOT gate output, the toggle flip flop output and to the second NOT gate output.

10. The ROM device of claim 7 wherein an address pattern recognition section includes a reference voltage applying section comprising two MOS FETs for providing a reference voltage of a low or high state, a second EXNOR gate array having a first input connected to the reference voltage applying section and a second input connected to the output stage of the row and column address buffer, a NAND gate array connected to the output stage of the second EXNOR gate array, a third NOR gate connected to the output stage of the NAND gate array, a 7-bit shift register connected to the output stage of the third NOR gate and to a reset signal stage of the instantaneous pulse generator, a second NAND gate having a first input stage directly connected to the first, third, fifth and seventh output bits of the shift, register, and a second input stage connected to the second, fourth and sixth output bits of the shift register through respective NOT gates, a fourth NOR gate in which the input stage is connected to the output stage of the second NAND gate, a second toggle Flip-Flop connected to the output stage of the fourth NOR gate and to the reset signal stage of the instantaneous pulse generator for generating a code comparison enable signal, a third delay section connected to the output stage of an address transition detect and clock generator in the control section for delaying a clock signal and then supplying a delay clock signal to the second toggle Flip-Flop and, a fifth NOR gate in which the input stages are connected to the clock signal generated from the address transition detect and clock generator and to the code comparison enable signal generated from the second toggle Flip-Flop and, the output stage is connected to the shift register through a NOT gate.

* * * * *